US008933522B2

(12) United States Patent
Manipatruni et al.

(10) Patent No.: US 8,933,522 B2
(45) Date of Patent: Jan. 13, 2015

(54) REPEATED SPIN CURRENT INTERCONNECTS

(71) Applicant: Intel Corporation, Santa Clara, CA (US)

(72) Inventors: Sasikanth Manipatruni, Hillsboro, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 13/630,499

(22) Filed: Sep. 28, 2012

(65) Prior Publication Data
US 2014/0091411 A1    Apr. 3, 2014

(51) Int. Cl.
*H01L 43/02*    (2006.01)
*H01L 27/22*    (2006.01)

(52) U.S. Cl.
CPC ............... *H01L 43/02* (2013.01); *H01L 27/22* (2013.01)
USPC ................... 257/421; 257/758; 257/E43.001; 257/E27.005

(58) Field of Classification Search
CPC ....... H01L 43/02; H01L 27/22; H01L 23/481; H01L 23/5226
USPC .................. 257/421, 758, E43.001, E27.004, 257/E27.005, E23.011, E23.141, E23.142, 257/E23.145
See application file for complete search history.

(56) References Cited

U.S. PATENT DOCUMENTS

| | | | | |
|---|---|---|---|---|
| 6,956,269 | B1 * | 10/2005 | Vashchenko et al. | 257/421 |
| 6,963,091 | B1 * | 11/2005 | Vashchenko et al. | 257/213 |
| 7,471,492 | B2 * | 12/2008 | Fukuzawa et al. | 360/322 |
| 7,528,456 | B1 * | 5/2009 | Khitun et al. | 257/421 |
| 7,577,078 | B2 | 8/2009 | Kim | |
| 7,678,475 | B2 * | 3/2010 | Slavin et al. | 428/811 |
| 8,064,246 | B2 * | 11/2011 | Slonczewski | 365/158 |
| 8,698,517 | B2 * | 4/2014 | Behin-Aein | 326/37 |
| 8,711,600 | B2 * | 4/2014 | Venkataraman et al. | 365/145 |
| 2006/0022220 | A1 * | 2/2006 | Inomata et al. | 257/214 |
| 2007/0253121 | A1 | 11/2007 | Yamada et al. | |
| 2010/0118603 | A1 | 5/2010 | Wang et al. | |
| 2012/0133008 | A1 | 5/2012 | Yamada et al. | |
| 2012/0154081 | A1 | 6/2012 | Suzuki | |

OTHER PUBLICATIONS

Patent Cooperation Treaty, Notification of Transmittal of the International Search Report and the Written Opinion of the International Searching Authority mailed Oct. 28, 2013, for international application No. PCT/US2013/048027.

* cited by examiner

*Primary Examiner* — Allison P Bernstein
(74) *Attorney, Agent, or Firm* — Trop, Pruner & Hu, P.C.

(57) ABSTRACT

One embodiment includes a metal layer including first and second metal portions; a ferromagnetic layer including a first ferromagnetic portion that directly contacts the first metal portion and a second ferromagnetic portion that directly contacts the second metal portion; and a first metal non-magnetic interconnect coupling the first ferromagnetic portion to the second ferromagnetic portion. The spin interconnect conveys spin polarized current suitable for spin logic circuits. The interconnect may be included in a current repeater such as an inverter or buffer. The interconnect may perform regeneration of spin signals. Some embodiments extend spin interconnects into three dimensions (e.g., vertically across layers of a device) using vertical non-magnetic metal interconnects. Spin interconnects that can communicate spin current without repeated conversion of the current between spin and electrical signals enable spin logic circuits by reducing power requirements, reducing circuit size, and increasing circuit speed.

31 Claims, 9 Drawing Sheets

REPEATED SPIN CURRENT INTERCONNECTS

BACKGROUND

Spin polarization concerns the degree to which the spin or intrinsic angular momentum of elementary particles is aligned with a given direction. This spin affects the conduction of electrons in ferromagnetic metals, such as iron, giving rise to spin polarized currents. Spin polarized current affects spin waves, which are propagating disturbances in the ordering of magnetic materials. Spin polarization also concerns spintronics, a branch of electronics concerning the intrinsic spin of an electron, its associated magnetic moment, and the electron's fundamental electronic charge. Spintronics devices concern Tunnel Magnetoresistance (TMR), which uses quantum-mechanical tunneling of electrons through a thin insulator to separate ferromagnetic layers, and Spin Torque Transfer (STT), where a current of spin polarized electrons may be used to control the magnetization direction of ferromagnetic electrodes.

BRIEF DESCRIPTION OF THE DRAWINGS

Features and advantages of embodiments of the present invention will become apparent from the appended claims, the following detailed description of one or more example embodiments, and the corresponding figures, in which:

FIG. 1b is a plan view of the embodiment of FIG. 1a.

FIG. 3b is a spin current vs. time plot for the embodiment of FIG. 3a.

DETAILED DESCRIPTION

Figure 1A:
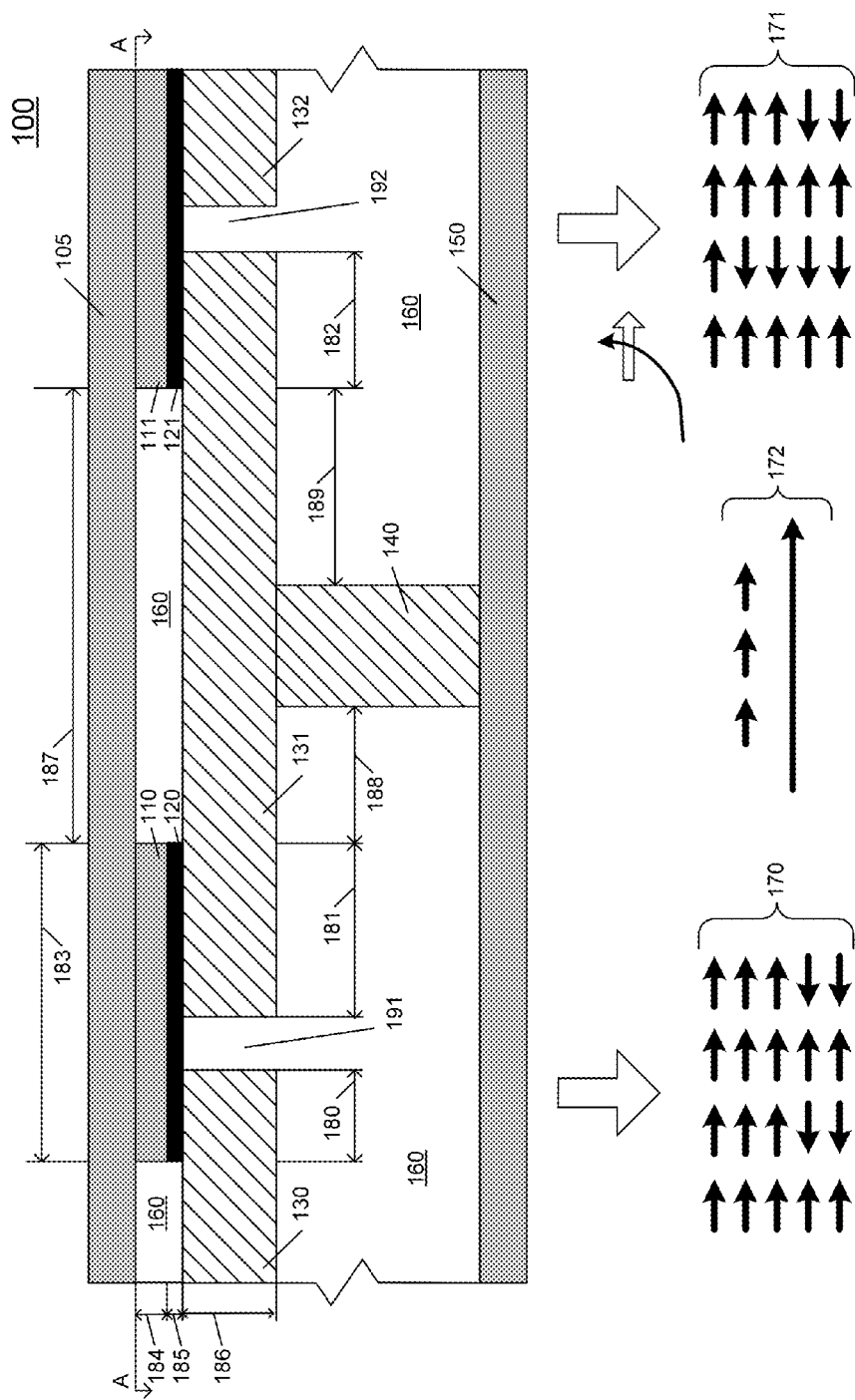
FIG. 1a is a cross-section view of an interconnect system in one embodiment of the invention.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

An embodiment includes one or more "spin interconnects" for circuits, such as spin logic circuits, spintronic logic, spintronic memory, and the like. An embodiment includes current repeaters (e.g., inverters and/or buffers) for spin logic circuits. Various embodiments use non-magnetic interconnects and magnetic repeaters to enable spin logic circuits. For example, an embodiment uses non-magnetic metal wire interconnects for spin current propagation with magnetic elements positioned at regular distances (or non-regular distances) along the wire to perform regeneration of spin signals. One embodiment includes an all spin interconnect system comprising nano-magnetic current repeaters communicating with one another (in a chain of repeaters) via nonmagnetic metallic interconnects. Some embodiments extend interconnects into three dimensions (e.g., vertically across layers of a device) using non-magnetic metallic interconnects, such as vias.

As indicated above, there are various embodiments described herein (described in more detail below). Many embodiments communicate a spin current signal without repeated conversion between spin and electrical signals (instead just regenerating spin current using interconnect systems described below). This helps enable spin logic circuits by reducing power requirements (i.e., by avoiding conversion losses altogether or essentially altogether), reducing circuit size, and increasing circuit speed. As one specific example of an advantage of embodiments described herein, such embodiments provide advantages over technologies such as spin wave interconnects. Spin waves have a low efficiency of spin-to-electrical and electrical-to-spin conversion. Also, with spin wave interconnects there is only a short distance of spin wave propagation before signal attenuation (~1 um). Other examples of advantages of some embodiments include the ability to create spin logic circuits that have their output spin signals communicate over longer distances without the need to convert to electrical charge. In other words, signals communicate over longer distances because of the local and semi-global spin interconnects located between spin logic circuits (where "local interconnects" interconnect small areas of a chip, over a distance such as 10-20 microns, and "global interconnects" interconnect areas separated by longer distances). Some embodiments provide signal regeneration for scaling the length of interconnects (e.g., allowing for longer interconnects or chains of interconnects). Various embodiments include or provide for three dimensional stackable all spin logic. For example, an embodiment allows for three dimensional integration of spin interconnects with non-magnetic metal interconnects (e.g., vias). The non-magnetic interconnect allows for three dimensional integration of the interconnect with nonmagnetic metal vias and avoid the use of magnetic vias. Thus, there are numerous advantages to the embodiments described herein.

Figure 1B:
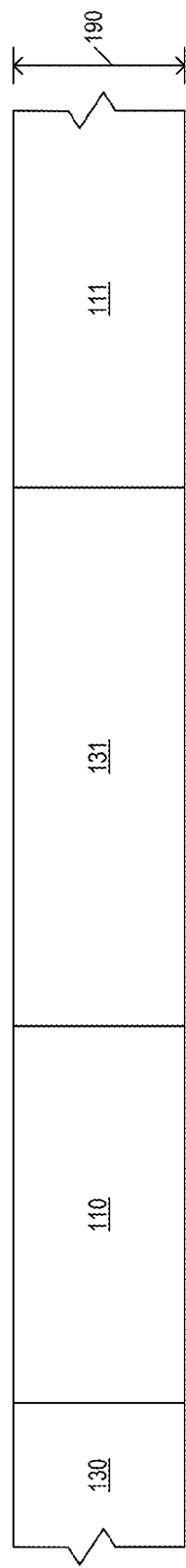

FIG. 1a is a cross-section view of an interconnect system 100 in one embodiment of the invention. FIG. 1b is a plan view of the embodiment. System or device 100 includes a substrate (not shown in this Figure), a metal layer, on the substrate, including metal portion 110 and metal portion 111 that do not directly contact one another.

In an embodiment, the semiconductive substrate is a bulk semiconductive material as part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

A ferromagnetic layer, on the substrate, includes ferromagnetic portion 120 that directly contacts metal portion 110 and ferromagnetic portion 121 that directly contacts metal portion 111 but not ferromagnetic portion 120. Metal interconnect 131 couples ferromagnetic portion 120 to ferromagnetic portion 121. There are no other ferromagnetic portions (beyond portions 120, 121) directly contacting either of metal portions 110, 111. In this embodiment metal spin interconnect 131 directly contacts ferromagnetic portions 120, 121, but other embodiments are not so limited and the contact may be indirect.

Ferromagnetic portion 120 overlaps metal interconnect 131 by distance 181 and ferromagnetic portion 121 overlaps metal interconnect 131 by distance 182. Distance 182 is shorter than distance 181 in this particular embodiment (but not so in other embodiments). In one embodiment 181 is between 10 and 300 nm and 182 is between 10 and 300 nm with 182 being shorter than 181 for signal flow from left to right. In one embodiment, 181 is 100 nm and 182 is 80 nm. In one embodiment, 181 is 150 nm and 182 is 100 nm. In one embodiment, 181 is 200 nm and 182 is 175 nm. In one embodiment, 181 is 275 nm and 182 is 250 nm. In one embodiment, 182 is 100 nm and 181 is 80 nm. In one embodiment, 182 is 150 nm and 181 is 100 nm. In one embodiment, 182 is 200 nm and 181 is 175 nm. In one embodiment, 182 is 275 nm and 181 is 250 nm System 100 communicates spin polarized current 172 (by way of supply voltage plane 105) from ferromagnetic portion 120 to ferromagnetic portion 121 based on distance 182 being shorter than distance 181. In other words, in this embodiment the current direction is dictated, at least in part, based on the dissimilar overlapping distances of portions 120, 121 and interconnect 131 (where current flows from the larger overlapped region to the small overlapped region).

In one embodiment, metal interconnect 131 couples to ground layer 150 via a "first location" on metal interconnect 131 (i.e., the junction of via/interconnect 140 and interconnect 131). In the embodiment of FIG. 1a the first location is closer to ferromagnetic portion 120 than it is to ferromagnetic portion 121. (Please note the figures within this application are not drawn to scale.) Specifically, in one embodiment distance 188 is shorter or smaller than distance 189. In one embodiment 188 is 50 nm and 189 is 500 nm. In one embodiment 188 is 100 nm and 189 is 400 nm. In one embodiment 188 is 250 nm and 189 is 250 nm. In one embodiment 188 is 400 nm and 189 is 100 nm. In one embodiment 188 is 500 nm and 189 is 50 nm System 100 communicates spin polarized current 172 (from supply voltage plane 105) via ferromagnetic portion 120 to ferromagnetic portion 121 based on the via 140/interconnect 131 junction being closer to ferromagnetic portion 120 than ferromagnetic portion 121. Sliding the via 140/interconnect 131 junction close to portion 121 may reverse current direction (depending on other factors such as, for example, the amount of overlap in regions 181 and 182).

Thus, current direction 172 may be dictated by distances 181/182, 188/189, or both 181/182 and 188/189. Furthermore, in addition to or instead of the above methods for determining spin current direction, the direction may further be controlled by varying injection efficiency (asymmetric spin current injection).

Arrows 170 show greater spin polarization (greater number of arrows pointing in the same direction) than arrows 171. This helps show how the dominant or master magnet (portion 120) injects net spin into system 100 towards the slave magnet (portion 121). Thus, as spin current weakens (arrows 171) the current is then regenerated via elements 111, 121 to increase again to a higher level (similar to arrows 170) (assuming current is moving left to right as is the case with FIG. 1a).

In an embodiment, metal interconnect 131 is non-magnetic. Metal interconnect may include copper, aluminum, graphene, tin, and the like. In one embodiment ferromagnetic portions 120 and/or 121 include at least one of nickel, cobalt, iron, gadolinium, and Huesler alloy and combinations thereof. In an embodiment any element for portions 120, 121 may be doped with, for example, boron or similar materials (e.g., to assist in nanofabrication). Another embodiment includes materials, similar to nickel, cobalt, iron, Huesler alloy, and gadolinium, which are suitable for 120/121 because, for example, they have good magnetization at room temperature and/or strong magnetic anisotropy.

Metal portions 110 and/or 111 may comprise at least one noble metal and at least one 5 d transition metal. Metal portions 110 and/or 111 may include materials comprising at least one of platinum, tantalum, copper, and gold (and combinations thereof), but other embodiments are not so limited. Other embodiments may include copper combined with an impurity. The impurity may include one or more 5 d transition metals such as lutetium, hafnium, tantalum, tungsten, rhenium, osmium, iridium, platinum, gold, and mercury. The tantalum may include beta phase tantalum in one embodiment. Other embodiments may include one or more these impurities combined with gold, silver, and/or platinum. Still other embodiments may include gold, silver, and/or platinum combined with one or more 4 d transition metal impurities such as yttrium, zirconium, niobium, molybdenum, technetium, ruthenium, rhodium, palladium, silver, and/or cadmium. Another embodiment may include mercury and tellurium. Still other embodiments may include artificially engineered metallic structures such as magnetic superlattices and other metal materials. Other embodiments include any of the noble metals combined with any 4 d or 5 d transition metal impurity. For example, such noble metals include gold, silver, platinum, ruthenium, rhodium, palladium, osmium, rhenium, and iridium. Other embodiments include materials similar to noble metals combined with any 4 d or 5 d transition metal impurity that are suitable for layer 110 and/or 111 because, for example, they exhibit spin dependent scattering and/or spin orbit interaction.

Various layers of system 100 are separated by oxide 160. Examples of materials described herein are non-exhaustive.

In one embodiment, metal portion 110 has length 183 and width 190 (see FIG. 1b). Metal portion 111 also has a length collinear with length 183. Length 183 is longer than width 190 in one embodiment. In one embodiment ferromagnetic portion 120 has length 183 and width 190 (i.e., same dimensions as portion 110). Thus, metal portion 110 has a first surface area dictated by length 183 and width 190, which is not smaller than a second surface area, defined by ferromagnetic portion length 183 and width 190. However, in other embodiments the surface area of metal portion 110 is greater than ferromagnetic portion 120. In some embodiments, portions 110, and 111 have similar dimensions (length, width, height) but differ in other embodiments.

In one embodiment the length for magnet layer 120 may be approximately half or one quarter of the length for metal layer 110. The length for magnet layer 120 (horizontal and running right-left in FIGS. 1a and 1b) may be approximately 50 nm and width 190 may be approximately 100 nm. In another embodiment the length for metal portion 110 is about 104 nm, the length for magnet portion 120 is about 26 nm, and width 190 for 110 and 120 is about 52 nm. However, in another embodiment magnet 120 length may be approximately 10, 20, 40, 60, 80, 100, 120, 140, 160, 180 nm or more, metal 110 length may be 50, 60, 70, 80, 120, 140, 160, 180 nm or more, and width 190 for 110 and 120 may be approximately 30, 40, 75, 150 nm or more. Other embodiments are not so limited.

In one embodiment, ferromagnetic portion thickness 185 is no greater than 5 nm and metal portion thickness 184 is no less than 5 nm. In one embodiment thickness 185 may be approximately 3 nm and thickness 184 for metal layer 110 may be approximately 10 nm However, other embodiments include thickness 185 for magnet layer 120 being approximately 1, 2, 4, 5, 6 nm or more and thickness 184 for metal layer 110 being approximately 5, 6, 7, 8, 9, 11, 12, 13, 14, 15, 16, 17, 18, 19, 20 nm or more.

In one embodiment, interconnect thickness 186 of between 10 nm and 1 micron but other embodiments are not so limited. In one embodiment ferromagnetic portion 120 is separated from ferromagnetic portion 121 by distance 187, which is between 25 nanometers and 15 microns but other embodiment are not so limited. In one embodiment, distance 187 is 100 nm In another embodiment distance 187 is 10 microns. In one embodiment interconnects 130, 131, and/or 132 each has a length between 100 nm and 10 microns, magnets 120, 121 each have ranges with dimensions as follows: thickness 0.1 nm to 10 nm, length 10 nm to 500 nm, and width 10 nm to 500 nm. However, other embodiments are not so limited.

In one embodiment, a "chain" of interconnects is formed with portions 110, 120 coupling interconnect 130 to interconnect 131 and portions 111, 121 coupling interconnect 131 to interconnect 132. Overlap region 180 may be equal to distance 182 but may differ in other embodiments. Isolation portions 191, 192 are between interconnects 130, 131, 132 and directly and respectively contact ferromagnetic portions 121, 121. In one embodiment isolation portions 191 and/or 192 are between 1 and 100 nm (but other embodiments are not so limited).

While portions 110, 120 appear rectangular in FIG. 1b in other embodiments one or both portions may be square, ovular or take on other shapes with rounded portions, and the like. Also, in FIG. 1b magnet layer 120 appears centered along metal 110, but in other embodiments magnet 120 may be lateral (left or right) of the midpoint for metal 110. Also, while in one embodiment width 190 is the same for each of portions 110, 120 in other embodiments the magnet portion may be wider or less wide than the metal portion.

In one embodiment supply voltage 105 is 1 mV to 100 mV (but other embodiments are not so limited).

Figure 2:
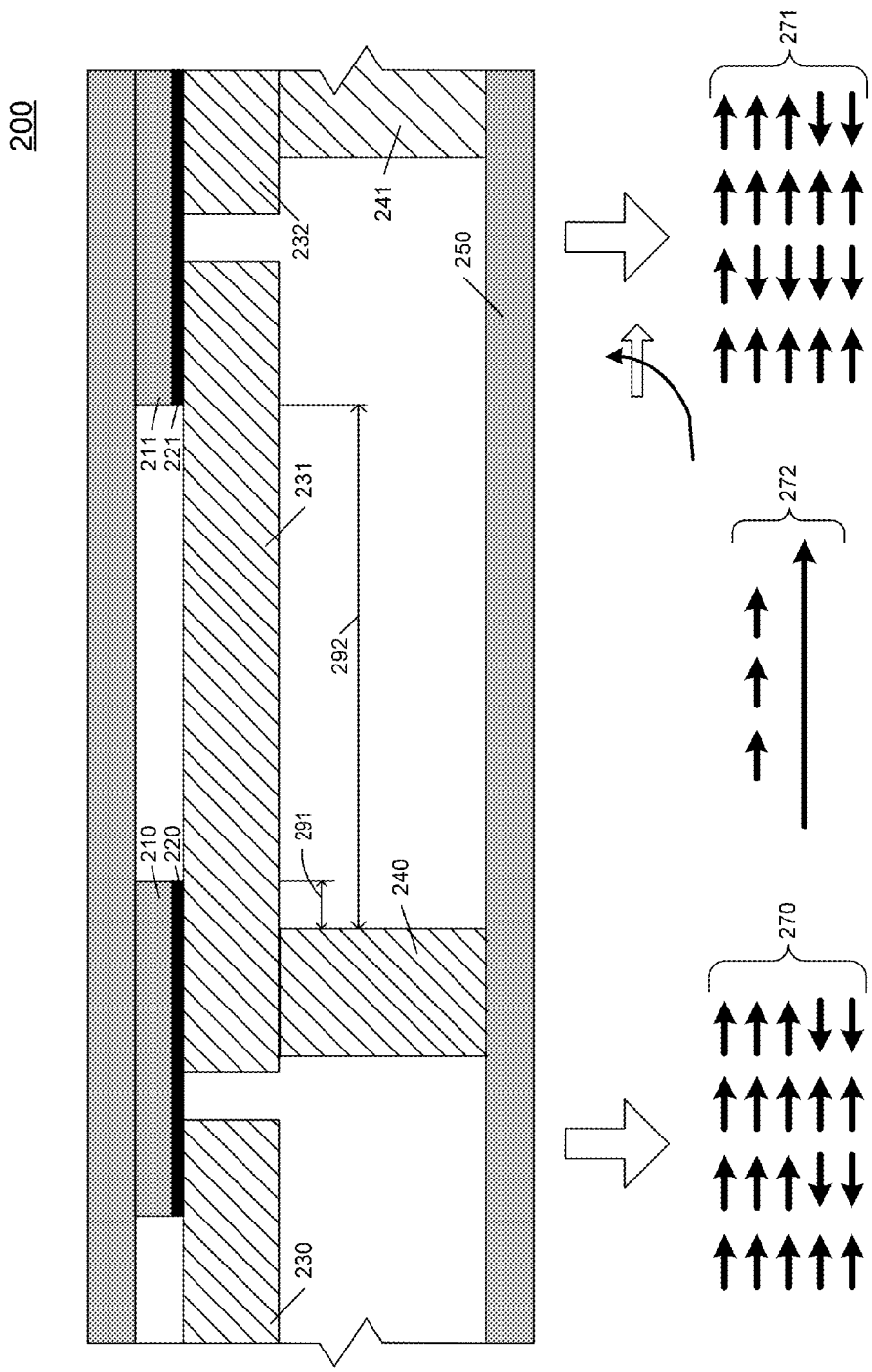
FIG. 2 is a cross-section view of an interconnect system in one embodiment of the invention.

FIG. 2 is a cross-section view of interconnect system 200 in one embodiment of the invention. System 200 is similar to system 100 of FIG. 1a but shows interconnect 240 moved closer to elements 210, 220 and further from elements 211, 221. Thus, interconnect/via 240 is separated from the right most end of portion 220 by distance 291 and from the left most end of portion 221 by distance 292 to help drive current from portion 220 to portion 221. In one embodiment, distance 292 is between 10 nm to 100 microns. A second interconnect/via 241 is also shown. In other embodiments interconnect 240 may be located equidistant from portions 220 and 221.

While not shown explicitly in any of FIGS. 1a, 1b and 2, an embodiment such as system 100 may include a third metal portion, included in the same metal layer as portions 110, 111 (and which does not directly contact either of portions 110, 111). Further, a third ferromagnetic portion, included in the same ferromagnetic layer as portions 120, 121, directly contacts the third metal portion (but not ferromagnetic portions 120, 121). For example, additional metal interconnect 132 couples ferromagnetic portion 121 to the third ferromagnetic portion (and does not directly contact metal interconnect 131 due to gap 192). This creates a longer "chain" of all spin (or substantially "all" spin) interconnects ("all spin" indicates no or almost no electrical to spin and spin to electrical conversions).

Figure 3A:
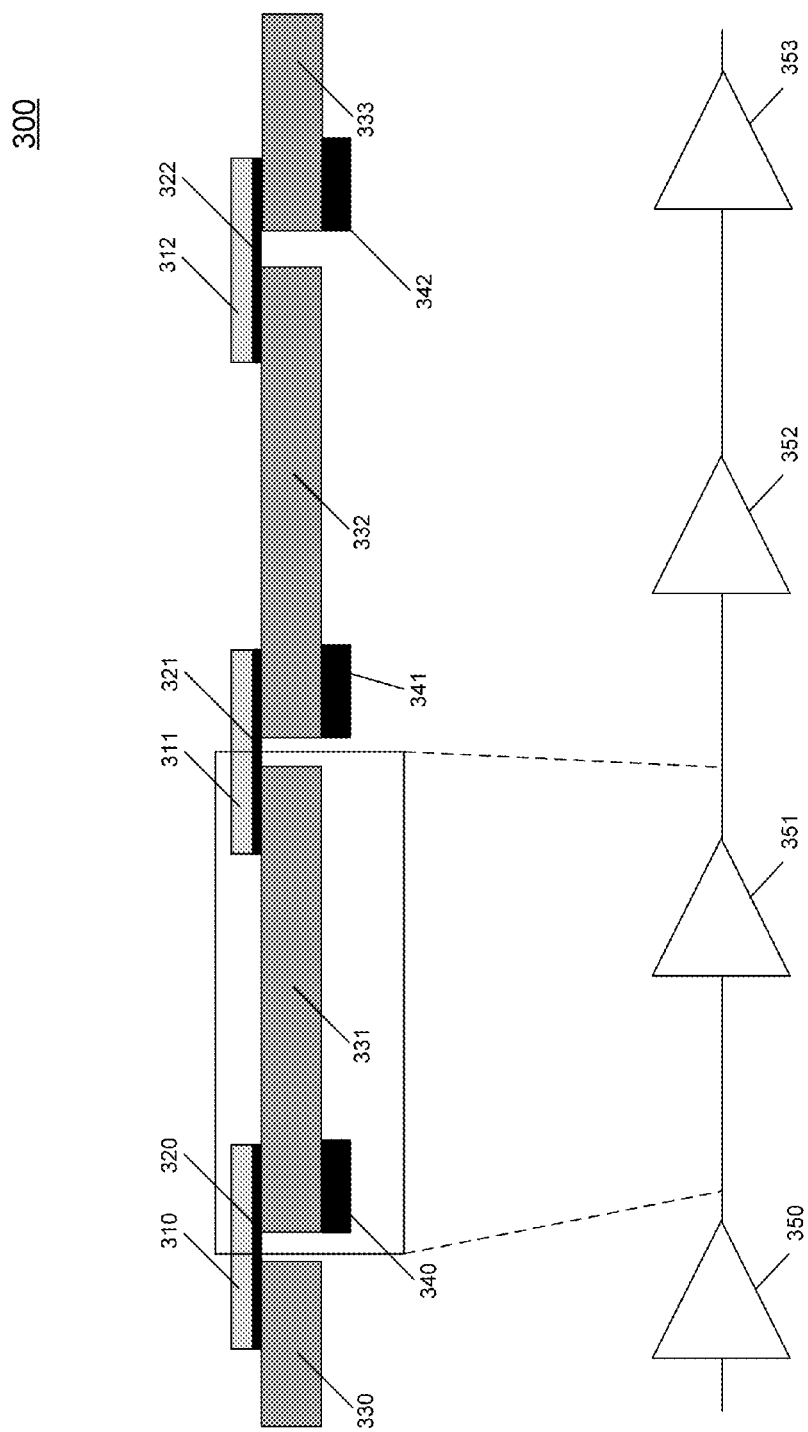
FIG. 3a is a cross-section view of a current repeater in one embodiment of the invention.
Figure 3B:
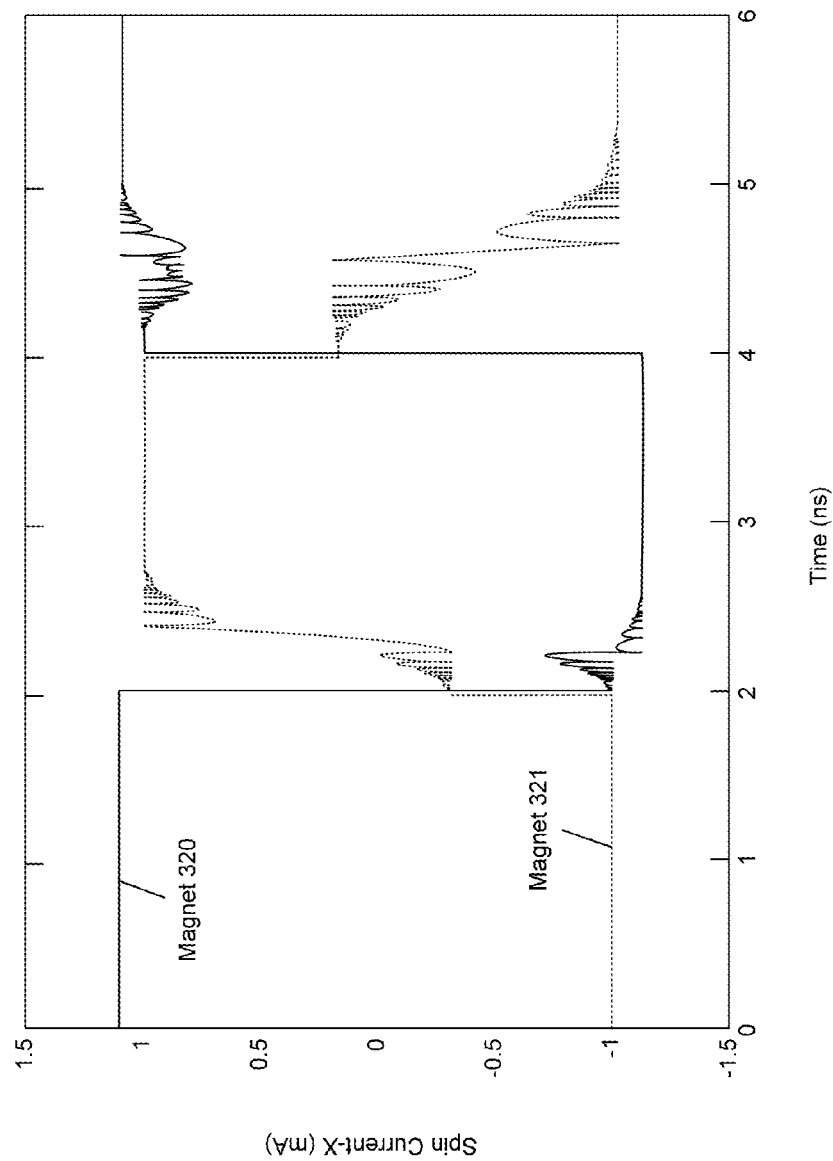

FIG. 3a is a cross-section view of a current repeater in one embodiment of the invention. FIG. 3b is a spin current vs. time plot for the embodiment of FIG. 3a. System 300 includes current repeaters 350, 351, 352, 353, all of which help maintain spin polarized current over distances to yield "all spin" interconnects (or substantially "all spin" interconnects).

Focusing on repeater 351 for explanation purposes, repeater 351 includes metal portions 310, 311 that respectively directly contact magnetic sections or portions 320, 321. Metal interconnect 331 couples to one end of section 321 and metal interconnect 332 couples to a second end, opposite the first end, of section 321. There are no additional magnetic sections directly contacting metal sections 310, 311. In one embodiment (but not all embodiments) interconnects 331, 332 each directly and respectively contact magnetic sections 320, 321. As with earlier described embodiments, interconnects 331, 332 may overlap magnetic section 321 by unequal amounts (to help drive current left to right in the figure). Vias 340, 341, 342 couple to ground (not shown) and are located along the left sides of interconnects 331, 332, 333 (to help drive current left to right in the figure). Interconnect 333 couples to interconnect 332 by way of metal portion 312 and magnetic portion 322. In one embodiment, interconnects 331, 332 are non-magnetic, sections 320, 321 are magnetic and include at least one of nickel, cobalt, iron, gadolinium, and Huesler alloy, and metal section 310, 311, 312 include at least one noble metal and at least one 5 d transition metal. System 300 may couple to a switching device included in a processor-based computing system such as system 700 of FIG. 7.

In one embodiment, the chain of repeaters in FIG. 3a includes more than two repeaters and in some embodiments may include 10, 50, 100 or more repeaters.

FIG. 3b includes a solid plot line for current from magnet element 320 and a dashed plot line for current from magnetic element 321. The plot shows the inverting nature of current when repeater 351 is an inverter. However, repeater 351 may also be a buffer wherein there is no inversion but the current is still "repeated" to further spin polarized current. In an embodiment the nature of power supply decides if a given device is an inverter or a buffer.

Figure 4:
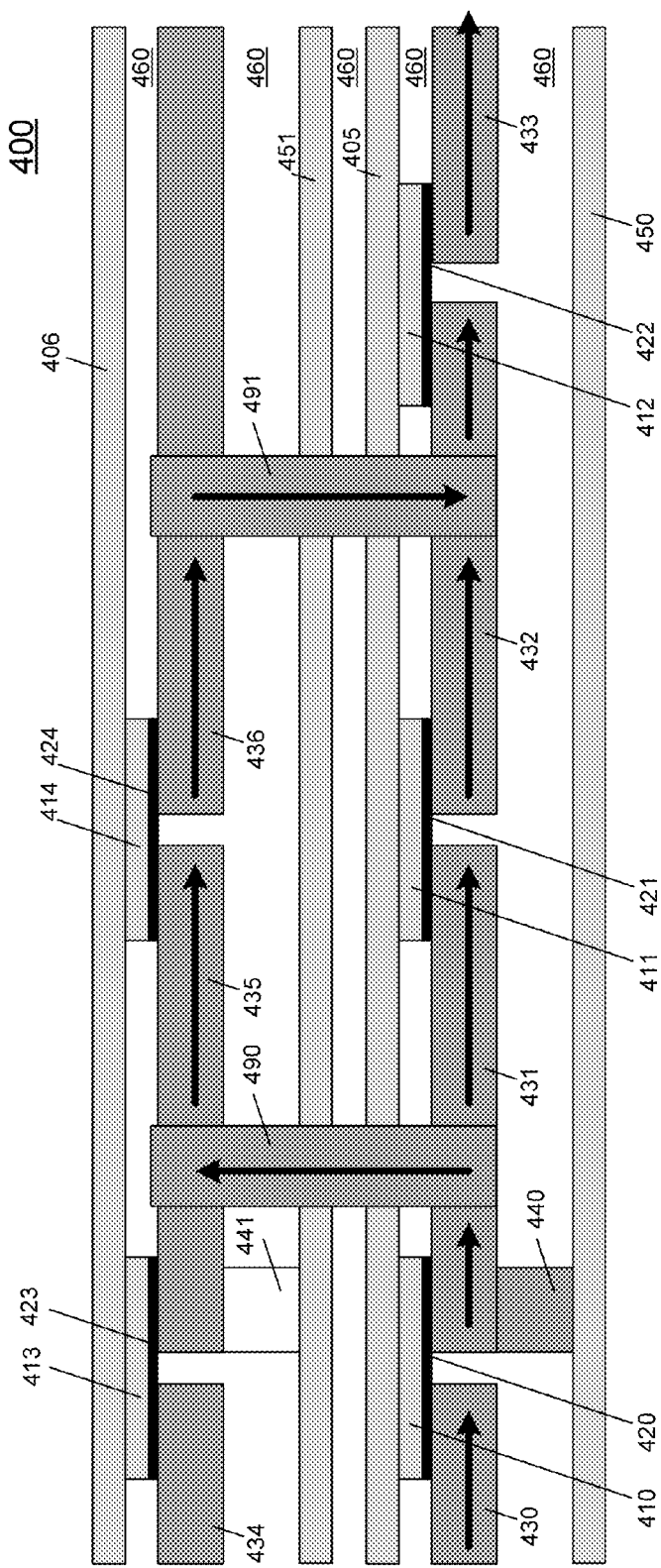
FIG. 4 is a cross-section view of a multilevel interconnect system in one embodiment of the invention.

FIG. 4 is a cross-section view of multilevel interconnect system 400 in one embodiment of the invention. System 400 includes metal members 410, 411, 412 in a metal layer and metal members 413, 414 in another metal layer. System 400 also includes magnetic members 420, 421, 422 in a magnetic layer and magnetic members 423, 424 in another magnetic layer. System 400 includes supply voltage planes 405, 406 (which may be coupled together in some embodiments to share a voltage), metal ground planes 451, 450, non-magnetic "horizontal spin interconnects" 430, 431, 432, 433, 434, 435, 436, and non-magnetic "vertical spin interconnects" or vias 490, 491. Interconnect 490, for example, may be metal and may directly contact metal interconnects 431, 435 (but other embodiments are not so limited). Various interconnects couple to ground by way of interconnects/vias 440, 441 (located off center on their respective interconnects). Oxide 460 may isolate various components of system 400. In one embodiment, one or more of metal interconnects directly contact their respective magnetic members.

As seen with other embodiments, in system 400 the metal interconnects overlap magnetic portions at varying levels. For example, interconnect 435 may overlap portion 423 more or less than portion 424.

In one embodiment, one of the ferromagnetic portions (e.g., portion 424 and/or portion 422) is included in a non-volatile memory and stores data in a non-volatile manner. Thus, an embodiment may include an interconnect with non-volatile storage capability. The spin interconnects may couple devices together such as coupling a transistor to a word line, data line, or gate line in a memory array.

In one embodiment supply voltage 406 is 10 mV and supply voltage 411 is 10 mV.

In one embodiment electrical shorting to ground (e.g., by way of ground via 440) is avoided due to the offsetting of ground vias along their respective interconnects (e.g., via 440 located along the left side of interconnect 431). Further, the dimensions of via 440 and the materials (e.g., aluminum or a high resistance alloy) used for via 440 may be arranged to increase resistance and decrease current flow to ground. Such dimensions may be the same or similar to dimensions for horizontal interconnects (e.g., 131) described herein buy are not so limited in other embodiments. For example, one embodiment includes an all metallic circuit where resistance of the circuit elements is small. Hence, the location of the grounding route/via has significance in the operation of the circuit.

Figure 5:
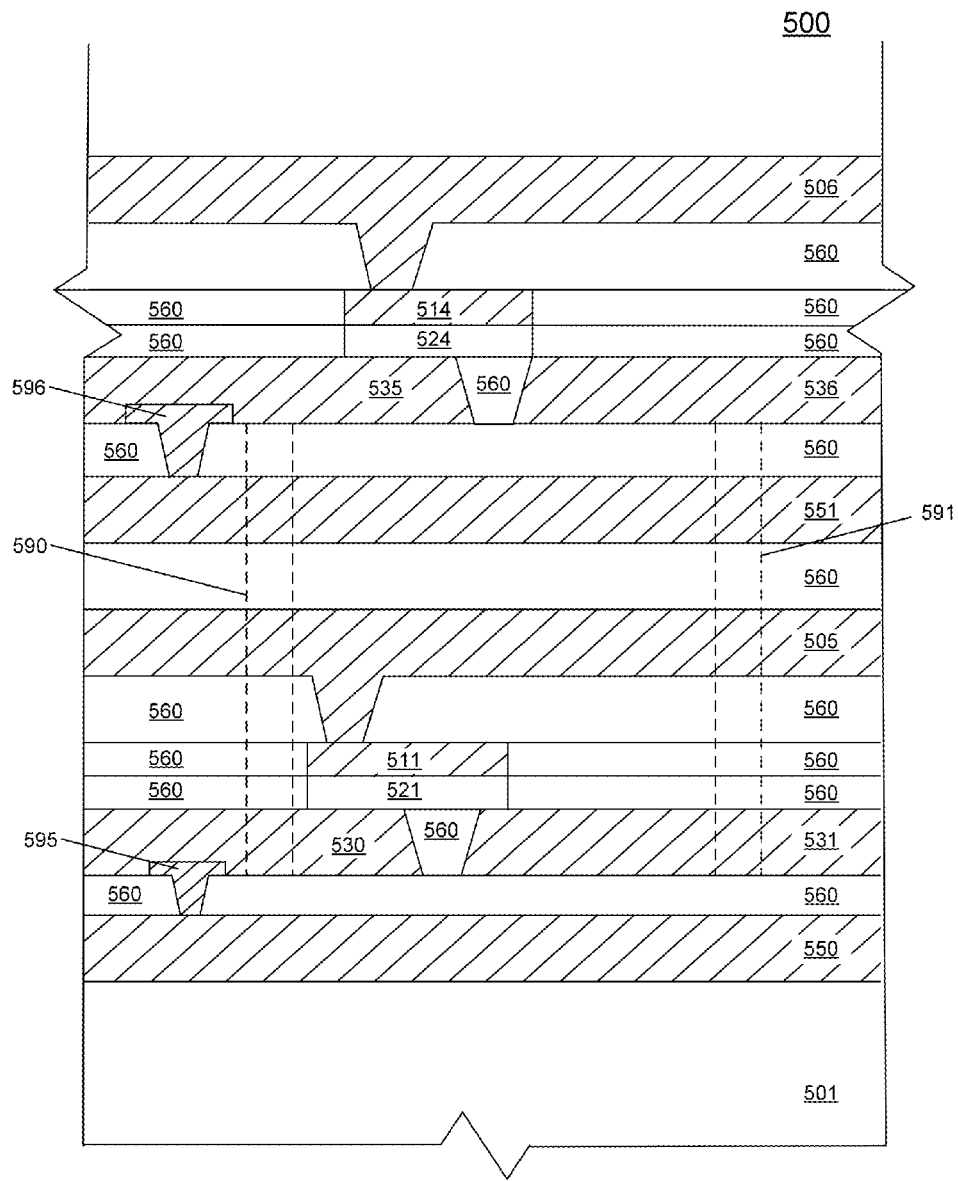
FIG. 5 is a cross-section view of a multilevel interconnect system in one embodiment of the invention.

FIG. 5 is a cross-section view of multilevel interconnect system/device 500 in one embodiment of the invention. System 500 includes substrate 501 upon which is located metal ground planes 550, 551, oxide layers 560, supply voltage power planes 505, 506, and ferromagnetic portions 521, 524 directly contacting horizontal spin interconnects 530, 531, 535, 536, and metal portions 511, 514. Non-magnetic metal vertical (or nearly vertical) spin interconnects 590, 591 couple to non-magnetic metal horizontal spin interconnects 530, 531, 535, 536. Interconnects 590, 591 may be "in plane" with FIG. 5 or "out of plane" (in front of or behind) with FIG. 5. Interconnects 530 and 535 couple to ground using vias 595, 596. In a manner similar to FIG. 4, FIG. 5 provides stacked logic layers using all spin interconnects. In various embodiments, planes such as power and ground planes and oxide layers may be shared to reduce the number of layers in system 500. The broken or jagged line of FIG. 5 (and elsewhere) indicates other layers may be included. Also, in FIG. 5 interconnect 535 is in the same vertical plane as interconnect 530, but that is not required in all embodiments.

Figure 6:
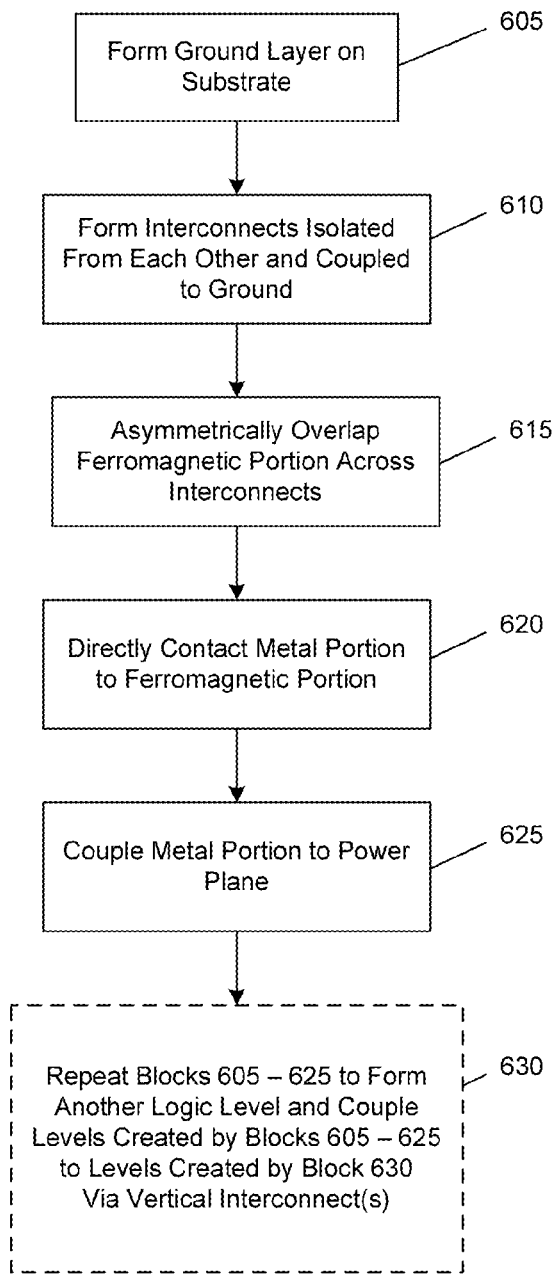
FIG. 6 is a method flow diagram in one embodiment of the invention.

FIG. 6 is a method flow diagram in one embodiment of the invention. Method 600 includes block 605 where a ground layer is formed on a substrate. Block 610 includes forming interconnects isolated from each other and coupled to ground through a via located in oxide. Block 615 includes asymmetrically overlapping ferromagnetic portions across interconnects. Block 620 includes directly contacting metal portions to ferromagnetic portions. Block 625 includes coupling metal portions to a power plane(s). Block 630 is included in some embodiments and includes repeating blocks 605-625 to form another logic level and coupling the logic levels created by blocks 605-625 to levels created by block 630 via metal vertical spin interconnects (that are non-magnetic).

An embodiment comprises: a substrate; a metal layer, on the substrate, including first and second metal portions that do not directly contact one another; a ferromagnetic layer, on the substrate, including a first ferromagnetic portion that directly contacts the first metal portion and a second ferromagnetic portion that directly contacts the second metal portion but not the first ferromagnetic portion; and a first metal interconnect coupling the first ferromagnetic portion to the second ferromagnetic portion.

Such an embodiment may include, for example, an array of all-spin interconnect lines (e.g., parallel to each other) that share metal portion 110. In other words, FIG. 1 would be a cross section taken parallel to any of the interconnect lines of the array. Thus, other interconnect lines would run parallel to line 131 but would not be seen in the two dimensional rendering that is FIG. 1. For example, metal portion 110 may be a metal line that runs perpendicular to the array of all-spin interconnect lines (i.e., line 110 runs "out of the page" and towards the viewer, instead of across the page such as line 131). Metal line 110 couples sections 130, 131 via portion 120 as well as other sections (130', 131' (not shown) that run parallel to lines 130, 131). In other words, single line 110 hits several all-spin interconnect lines (130/131 which are parallel to 130'/131' in an array of interconnects). Each all-spin interconnect line may have its own ferromagnetic section (e.g., portion 120 for interconnect lines 130, 131 and portion 120' for interconnect lines 130', 131'). Thus, line 110 would hit multiple ferromagnetic sections (such as 120, 120'), one for each all-spin interconnect line. In such an embodiment, there is no other ferromagnetic portion that is (a) directly contacting metal portion 110, and (b) that is directly over portion 120. For example, ferromagnetic portion 120' may be in the same layer as 120 but would not be directly over or under portion 120 (i.e., a vertical axis perpendicular to a plane including portion 120 would not intersect both line 110 and portion 120).

In another embodiment, a ferromagnetic portion, such as portion 120, may couple or connect to two interconnect lines. For example, portion 120 may directly connect to line 131 as well as line 131' (which is parallel to line 130 but not shown in FIG. 1). In other words, section 120 directly connects to lines 130 and 131. However, portion 120 also directly connects to lines 130' and 131' (which are in the same layer as lines 130, 131 and are parallel to lines 130, 131). In one embodiment, portion 120 may indirectly couple to lines 130 and 131 and to lines 130' and 131'.

Another embodiment includes first and second metal members that do not directly contact one another; a first magnetic member directly contacting the first metal member and a second magnetic member directly contacting the second metal member; and a first metal interconnect coupling the first magnetic member to the second magnetic member. Such an embodiment may be included in an array of interconnects such as the one described above. In such an embodiment, a single member/line (e.g., 110) hits several all-spin interconnect lines (130/131 which are parallel to 130'/131' in an array of interconnects). First and second magnetic members need not be in the same layer. First and second metal members need not be in the same layer.

Figure 7:
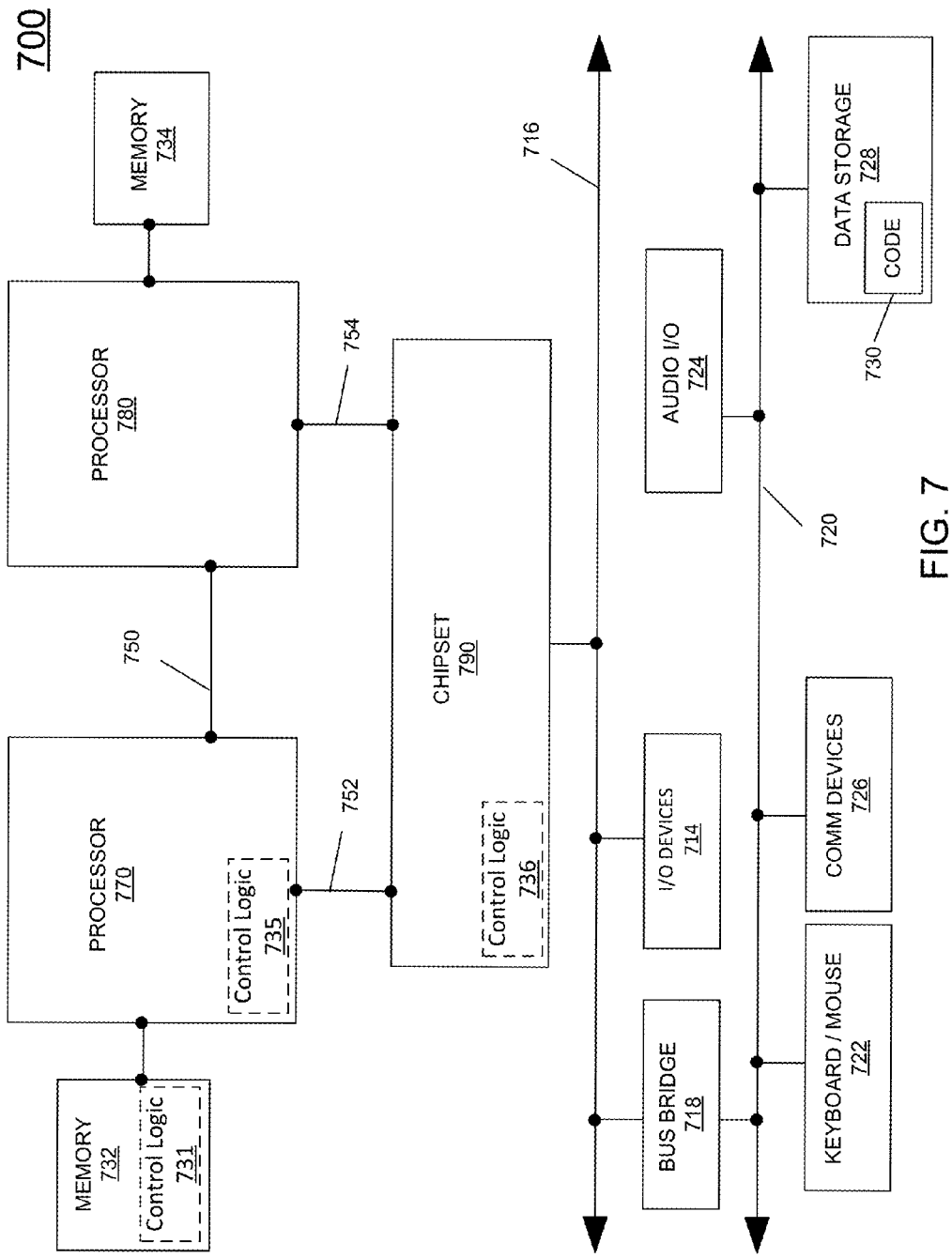
FIG. 7 is a system for operation with an embodiment of the invention.

Embodiments may be used in many different types of systems. For example, in one embodiment a communication device (e.g., cell phone, smartphone, netbook, notebook, personal computer, watch, camera) can be arranged to include various embodiments described herein. Referring now to FIG. 7, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM)) locally attached to the respective processors. First processor 770 and second processor 780 may be coupled to a chipset 790 via P-P interconnects, respectively. Chipset 790 may include P-P interfaces. Furthermore, chipset 790 may be coupled to a first bus 716 via an interface. Various input/output (I/O) devices 714 may be coupled to first bus 716, along with a bus bridge 718, which couples first bus 716 to a second bus 720. Various devices may be coupled to second bus 720 including, for example, a keyboard/mouse 722, communication devices 726, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 720.

One embodiment includes an apparatus comprising: a substrate; a metal layer, on the substrate, including first and second metal portions that do not directly contact one another; a ferromagnetic layer, on the substrate, including a first ferromagnetic portion that directly contacts the first metal portion and a second ferromagnetic portion that directly contacts the second metal portion but not the first ferromagnetic portion; and a first metal interconnect coupling the first ferromagnetic portion to the second ferromagnetic portion; wherein there is not another ferromagnetic layer directly contacting either of the first and second metal portions. In an embodiment the first metal interconnect directly contacts the first and second ferromagnetic portions. In an embodiment the first ferromagnetic portion overlaps the first metal interconnect by a first distance and the second ferromagnetic portion overlaps the first metal interconnect by a second distance that is shorter than the first distance. In an embodiment the apparatus is to communicate spin polarized current from the first ferromagnetic portion to the second ferromagnetic portion based on the second distance being shorter than the first distance. In an embodiment the first metal interconnect is to couple to ground via a first location on the first metal interconnect and the first location is closer to the first ferromagnetic portion than the second ferromagnetic portion. In an embodiment the apparatus is to communicate spin polarized current from the first ferromagnetic portion to the second ferromagnetic portion based on the first location being closer to the first ferromagnetic portion than the second ferromagnetic portion. In an embodiment (a) the first metal interconnect is to couple to ground via a first location on the first metal interconnect and the first location is closer to the first ferromagnetic portion than the second ferromagnetic portion, and (b) the apparatus is to communicate spin polarized current from the first ferromagnetic portion to the second ferromagnetic portion based on the first location being closer to the first ferromagnetic portion than the second ferromagnetic portion. In an embodiment the first metal interconnect is non-magnetic. In an embodiment the first ferromagnetic portion includes at least one of nickel, cobalt, iron, gadolinium, and Huesler alloy. In an embodiment the first and second metal portions each comprise at least one noble metal and at least one 5 d transition metal. In an embodiment the first metal portion has a first metal portion length and a first metal portion width, the second metal portion has a second metal portion length and a second metal portion width, the first and second metal portion lengths are collinear, and the first metal portion length is longer than the first metal portion width. In an embodiment the first ferromagnetic portion has a first ferromagnetic portion length and a first ferromagnetic portion width, and the first metal portion has a first surface area, defined by the first metal portion length and width, that is not smaller than a second surface area, defined by the first ferromagnetic portion length and width. In an embodiment the first ferromagnetic portion thickness is no greater than 5 nm, the first metal portion thickness is no less than 5 nm. In an embodiment the first ferromagnetic portion is separated from the second ferromagnetic portion by more than 25 nanometers and less than 15 microns. An embodiment comprises a third metal portion, included in the metal layer, that does not directly contact either of the first and second metal layer portions; a third ferromagnetic portion, included in the ferromagnetic layer, that directly contacts the third metal portion but not the first and second ferromagnetic portions; and a second metal interconnect coupling the second ferromagnetic portion to the third ferromagnetic portion and which does not directly contact the first metal interconnect. An embodiment comprises an additional metal layer, on the substrate, including third and fourth metal portions that do not directly contact one another; an additional ferromagnetic layer, on the substrate, including a third ferromagnetic portion that directly contacts the third metal portion and a fourth ferromagnetic portion that directly contacts the fourth metal portion but not the third ferromagnetic portion; and a second metal interconnect coupling the third ferromagnetic portion to the fourth ferromagnetic portion; a nonmagnetic vertical interconnect coupling the first and second metal interconnects. In an embodiment the nonmagnetic vertical interconnect is metal and directly contacts the first and second metal interconnects. In an embodiment one of the first and second ferromagnetic portions is included in a non-volatile memory and is to store data in a non-volatile manner. In an embodiment one of the first and second ferromagnetic portions is included in one of a buffer and an inverter. An embodiment comprises an isolation portion (a) between the first interconnect and a second interconnect, and (d) directly contacting the second ferromagnetic portion. An embodiment comprises an isolation portion (a) between the first interconnect and a second interconnect, the second interconnect being coplanar with the first interconnect, and (b) directly contacting the second ferromagnetic portion.

In an embodiment an apparatus comprises first and second metal members that do not directly contact one another; a first magnetic member directly contacting the first metal member and a second magnetic member directly contacting the second metal member; and a first metal interconnect coupling the first magnetic member to the second magnetic member; wherein there is no additional magnetic member directly contacting either of the first and second metal members. In an embodiment the first metal member is included in a first metal layer and the second metal member is included in a second metal layer that is non-coplanar with the first metal layer. In an embodiment the first metal interconnect directly contacts the first and second magnetic members. In an embodiment the first magnetic member overlaps the first metal interconnect by a first distance and the second magnetic member overlaps the first metal interconnect by a second distance that is shorter than the first distance, and the first metal interconnect is to couple to ground via a first location on the first metal interconnect and the first location is closer to the first magnetic member than the second magnetic member. An embodiment comprises a third metal member that does not directly contact either of the first and second metal layer members; a third magnetic member that directly contacts the third metal member but not the first and second magnetic members; and a second metal interconnect coupling the third magnetic member to the first interconnect and one of the first and second magnetic members.

An embodiment comprises a current repeater including a metal section directly contacting a magnetic section; and a first metal interconnect coupling to one end of the magnetic section and a second metal interconnect coupling to a second end, opposite the first end, of the magnetic section; wherein there is no additional magnetic section directly contacting the metal section. In an embodiment the first and second interconnects each directly contact the magnetic section. In an embodiment the first and second interconnects overlap the magnetic section by unequal amounts. In an embodiment the first interconnect is non-magnetic, the magnetic section includes at least one of nickel, cobalt, iron, gadolinium, and Huesler alloy, and the metal section includes at least one noble metal and at least one 5 d transition metal. In an embodiment the second interconnect couples to a switching device included in a processor-based computing system.

In an embodiment an apparatus comprises: a substrate; a metal layer, on the substrate, including first and second metal portions that do not directly contact one another; a ferromagnetic layer, on the substrate, including a first ferromagnetic portion that directly contacts the first metal portion and a second ferromagnetic portion that directly contacts the second metal portion but not the first ferromagnetic portion; and a first metal interconnect coupling the first ferromagnetic portion to the second ferromagnetic portion. In an embodiment the first metal interconnect directly contacts the first and second ferromagnetic portions. In an embodiment there is not another ferromagnetic layer directly contacting either of the first and second metal portions. In an embodiment there is no other ferromagnetic layer that is (a) directly contacting either of the first and second metal portions, and (b) that is directly over either of the first and second ferromagnetic portions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a substrate;
   a metal layer, on the substrate, including first and second metal portions that do not directly contact one another;
   a ferromagnetic layer, on the substrate, including a first ferromagnetic portion that directly contacts the first metal portion and a second ferromagnetic portion that directly contacts the second metal portion but not the first ferromagnetic portion;
   a first metal interconnect coupling the first ferromagnetic portion to the second ferromagnetic portion; and
   an isolation portion (a) between the first interconnect and a second interconnect, and (b) directly contacting the second ferromagnetic portion;
   wherein there is not another ferromagnetic layer directly contacting either of the first and second metal portions.

2. The apparatus of claim 1, wherein the first metal interconnect directly contacts the first and second ferromagnetic portions.

3. The apparatus of claim 1, wherein the first ferromagnetic portion overlaps the first metal interconnect by a first distance and the second ferromagnetic portion overlaps the first metal interconnect by a second distance that is shorter than the first distance.

4. The apparatus of claim 3, wherein the apparatus is to communicate spin polarized current from the first ferromagnetic portion to the second ferromagnetic portion based on the second distance being shorter than the first distance.

5. The apparatus of claim 3, wherein the first metal interconnect is to couple to ground via a first location on the first metal interconnect and the first location is closer to the first ferromagnetic portion than the second ferromagnetic portion.

6. The apparatus of claim 5, wherein the apparatus is to communicate spin polarized current from the first ferromagnetic portion to the second ferromagnetic portion based on the first location being closer to the first ferromagnetic portion than the second ferromagnetic portion.

7. The apparatus of claim 1 wherein (a) the first metal interconnect is to couple to ground via a first location on the first metal interconnect and the first location is closer to the first ferromagnetic portion than the second ferromagnetic portion, and (b) the apparatus is to communicate spin polarized current from the first ferromagnetic portion to the second ferromagnetic portion based on the first location being closer to the first ferromagnetic portion than the second ferromagnetic portion.

8. The apparatus of claim 1, wherein the first metal interconnect is non-magnetic.

9. The apparatus of claim 1, wherein the first ferromagnetic portion includes at least one of nickel, cobalt, iron, gadolinium, and Huesler alloy.

10. The apparatus of claim 1, wherein the first and second metal portions each comprise at least one noble metal and at least one 5 d transition metal.

11. The apparatus of claim 1, wherein the first metal portion has a first metal portion length and a first metal portion width, the second metal portion has a second metal portion length and a second metal portion width, the first and second metal portion lengths are collinear, and the first metal portion length is longer than the first metal portion width.

12. The apparatus of claim 11, wherein the first ferromagnetic portion has a first ferromagnetic portion length and a first ferromagnetic portion width, and the first metal portion has a first surface area, defined by the first metal portion length and width, that is not smaller than a second surface area, defined by the first ferromagnetic portion length and width.

13. The apparatus of claim 1, wherein the first ferromagnetic portion thickness is no greater than 5 nm, the first metal portion thickness is no less than 5 nm.

14. The apparatus of claim 1, wherein the first ferromagnetic portion is separated from the second ferromagnetic portion by more than 25 nanometers and less than 15 microns.

15. The apparatus of claim 1 comprising:
   a third metal portion, included in the metal layer, that does not directly contact either of the first and second metal layer portions;
   a third ferromagnetic portion, included in the ferromagnetic layer, that directly contacts the third metal portion but not the first and second ferromagnetic portions; and
   the second interconnect coupling the second ferromagnetic portion to the third ferromagnetic portion and which does not directly contact the first metal interconnect.

16. The apparatus of claim 1 comprising:
an additional metal layer, on the substrate, including third and fourth metal portions that do not directly contact one another;
an additional ferromagnetic layer, on the substrate, including a third ferromagnetic portion that directly contacts the third metal portion and a fourth ferromagnetic portion that directly contacts the fourth metal portion but not the third ferromagnetic portion; and
the second interconnect coupling the third ferromagnetic portion to the fourth ferromagnetic portion;
a nonmagnetic vertical interconnect coupling the first metal interconnect and the second interconnect.

17. The apparatus of claim 16, wherein the nonmagnetic vertical interconnect is metal and directly contacts the first interconnect and the second interconnect.

18. The apparatus of claim 1, wherein one of the first and second ferromagnetic portions is included in a non-volatile memory and is to store data in a non-volatile manner.

19. The apparatus of claim 1, wherein one of the first and second ferromagnetic portions is included in one of a buffer and an inverter.

20. The apparatus of claim 1, wherein the second interconnect is coplanar with the first metal interconnect.

21. An apparatus comprising:
first and second metal members that do not directly contact one another;
a first magnetic member directly contacting the first metal member and a second magnetic member directly contacting the second metal member; and
a first metal interconnect coupling the first magnetic member to the second magnetic member;
wherein (a) there is no additional magnetic member directly contacting either of the first and second metal members, and (b) the first metal member is included in a first metal layer and the second metal member is included in a second metal layer that is non-coplanar with the first metal layer.

22. The apparatus of claim 21, wherein the first magnetic member overlaps the first metal interconnect by a first distance and the second magnetic member overlaps the first metal interconnect by a second distance that is shorter than the first distance, and the first metal interconnect is to couple to ground via a first location on the first metal interconnect and the first location is closer to the first magnetic member than the second magnetic member.

23. The apparatus of claim 21 comprising:
a third metal member that does not directly contact either of the first and second metal members;
a third magnetic member that directly contacts the third metal member but not the first and second magnetic members; and
a second metal interconnect coupling the third magnetic member to the first interconnect and one of the first and second magnetic members.

24. An apparatus comprising:
a current repeater including a metal section directly contacting a magnetic section; and
a first metal interconnect coupling to one end of the magnetic section and a second metal interconnect coupling to a second end, opposite the first end, of the magnetic section;
wherein there is no additional magnetic section directly contacting the metal section.

25. The apparatus of claim 24, wherein the first and second interconnects each directly contact the magnetic section.

26. The apparatus of claim 24, wherein the first and second interconnects overlap the magnetic section by unequal amounts.

27. The apparatus of claim 26, wherein the second interconnect couples to a switching device included in a processor-based computing system.

28. An apparatus comprising:
a substrate;
a metal layer, on the substrate, including first and second and third metal portions that do not directly contact one another;
a ferromagnetic layer, on the substrate, including a first ferromagnetic portion that directly contacts the first metal portion, a second ferromagnetic portion that directly contacts the second metal portion but not the first ferromagnetic portion, and a third ferromagnetic portion that directly contacts the third metal portion but not the first and second ferromagnetic portions; and
a first metal interconnect coupling the first ferromagnetic portion to the second ferromagnetic portion and a second metal interconnect coupling the second ferromagnetic portion to the third ferromagnetic portion and which does not directly contact the first metal interconnect.

29. The apparatus of claim 28, wherein the first metal interconnect directly contacts the first and second ferromagnetic portions.

30. The apparatus of claim 28, wherein there is not another ferromagnetic layer directly contacting either of the first and second metal portions.

31. The apparatus of claim 28, wherein there is no other ferromagnetic layer that is (a) directly contacting either of the first and second metal portions, and (b) that is directly over either of the first and second ferromagnetic portions.

* * * * *